(12) United States Patent
Kim

(10) Patent No.: US 7,843,266 B2
(45) Date of Patent: Nov. 30, 2010

(54) AMPLIFIER FOR IMPROVING ELECTROSTATIC DISCHARGE CHARACTERISTIC

(75) Inventor: Yo-Jong Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/492,646

(22) Filed: Jun. 26, 2009

(65) Prior Publication Data

US 2009/0261906 A1 Oct. 22, 2009

Related U.S. Application Data

(62) Division of application No. 11/820,177, filed on Jun. 18, 2007, now Pat. No. 7,564,310.

(30) Foreign Application Priority Data

Aug. 30, 2006 (KR) ............. 10-2006-0082966

(51) Int. Cl.
*H03G 3/12* (2006.01)
(52) U.S. Cl. .................. 330/282; 330/86
(58) Field of Classification Search ............... 330/86, 330/282, 291, 293
See application file for complete search history.

(56) References Cited

U.S. PATENT DOCUMENTS

| 4,100,437 A | 7/1978 | Hoff, Jr. | |
| --- | --- | --- | --- |
| 4,551,685 A * | 11/1985 | Kerns et al. | 330/282 |
| 6,900,698 B2 | 5/2005 | Ikeda | |
| 2005/0017796 A1 * | 1/2005 | Tanizawa | 327/562 |
| 2006/0012436 A1 | 1/2006 | Akai et al. | |
| 2006/0049466 A1 | 3/2006 | Egawa et al. | |

FOREIGN PATENT DOCUMENTS

| JP | 11-121694 | 4/1999 |
| --- | --- | --- |
| JP | 2004-222101 | 8/2004 |
| JP | 2006-33175 | 2/2006 |
| JP | 2006-73937 | 3/2006 |
| KR | 10-0198623 B1 | 3/1999 |
| KR | 10-2006-0047944 | 5/2006 |
| KR | 10-2006-0050113 | 5/2006 |

* cited by examiner

*Primary Examiner*—Khanh V Nguyen
(74) *Attorney, Agent, or Firm*—Mills & Onello, LLP

(57) ABSTRACT

An amplifier for improving an electrostatic discharge (ESD) characteristic includes an operational amplifier, a first resistor circuit, a first fuse box, a second resistor circuit, and a second fuse box. The operational amplifier includes a first input terminal receiving a first input signal, a second input terminal receiving a second input signal, and an output terminal outputting an output signal. The first resistor circuit is connected between the second input terminal and a first node to prevent ESD from being input to the second input terminal. The first fuse box is connected between the first node and the output terminal of the operational amplifier. The second resistor circuit is connected between the second input terminal and a second node to prevent ESD from being input to the second input terminal. The second fuse box is connected between the second node and a terminal for receiving a ground voltage.

2 Claims, 3 Drawing Sheets

AMPLIFIER FOR IMPROVING ELECTROSTATIC DISCHARGE CHARACTERISTIC

CROSS-REFERENCE TO RELATED PATENT APPLICATION

This application is a divisional of U.S. application Ser. No. 11/820,177, filed on Jun. 18, 2007, which relies for priority upon Korean Patent Application No. 10-2006-0082966, filed on Aug. 30, 2006, the contents of which are herein incorporated by reference in their entirety.

FIELD OF THE INVENTION

The present invention relates to an amplifier, and more particularly, to an amplifier including a fuse box capable of compensating for an offset of the amplifier.

DESCRIPTION OF THE RELATED ART

An amplifier is included in a semiconductor device (e.g., a display driver integrated circuit (IC)) and amplifies an input signal or a difference between input signals by a predetermined gain so as to output an output signal having a desired magnitude according to the application in which it is being used. However, the magnitude of an output signal of the amplifier may not be exactly the same as a target value set during design of the amplifier due to characteristics such as process change and temperature change occurring during manufacturing of the amplifier. A difference between the target value set during the design and the magnitude of an actual output signal of the amplifier is referred to as an offset.

In order to compensate for the offset, a fuse box is provided between at least one input terminal and an output terminal in the amplifier. The fuse box includes a plurality of resistors connected in series and a plurality of fuses connected in parallel with the respective resistors. The offset of the amplifier can be compensated for by cutting at least one fuse using a laser.

When the amplifier is manufactured, a polishing process is performed to planarize the rear of an IC on which the amplifier is formed, after at least one fuse is cut. Electrostatic discharge (ESD) generated during the polishing process may destroy a gate oxide layer of a metal-oxide semiconductor (MOS) transistor forming an input terminal of the amplifier. As a result, the amplifier may not generate a desired output signal.

SUMMARY OF THE INVENTION

Some embodiments of the present invention provide an amplifier for preventing an electrostatic discharge input to an input terminal of an amplifier.

According to some embodiments of the present invention, there is provided an amplifier including an operational amplifier including a first input terminal receiving a first input signal, a second input terminal receiving a second input signal, and an output terminal outputting an output signal; a first resistor circuit connected between the second input terminal and a first node; a first fuse box connected between the first node and the output terminal of the operational amplifier; a second resistor circuit connected between the second input terminal and a second node; and a second fuse box connected between the second node and a first terminal for receiving a first voltage.

The first fuse box may include a plurality of first resistors connected in series between the first node and the output terminal of the operational amplifier; and a plurality of first fuses which can be cut and are connected in parallel with the first resistors, respectively. The second fuse box may include a plurality of second resistors connected in series between the second node and the first terminal; and a plurality of second fuses which can be cut and are connected in parallel with the second resistors, respectively.

Resistance values of the first resistors may be different from each other and resistance values of the second resistors may be different from each other. The first voltage may be a ground voltage.

According to other embodiments of the present invention, there is provided an amplifier including an operational amplifier including a first input terminal receiving a first input signal, a second input terminal receiving a second input signal, and an output terminal outputting an output signal; a first resistor circuit connected between the second input terminal and a node; a first fuse box connected between the node and the output terminal of the operational amplifier; and a second fuse box connected between the node and a first terminal for receiving a first voltage.

The first fuse box may include a plurality of first resistors connected in series between the node and the output terminal of the operational amplifier; and a plurality of first fuses which can be cut and are connected in parallel with the first resistors, respectively. The second fuse box may include a plurality of second resistors connected in series between the node and the first terminal; and a plurality of second fuses which can be cut and are connected in parallel with the second resistors, respectively.

The amplifier may further include a second resistor circuit connected between a terminal of the first fuse box and the output terminal of the operational amplifier and/or a third resistor circuit connected between a terminal of the second fuse box and the first terminal.

According to further embodiments of the present invention, an amplifier includes an operational amplifier comprising a first input terminal receiving a first input signal, a second input terminal receiving a second input signal, and an output terminal outputting an output signal; a first fuse box connected between the second input terminal and the output terminal of the operational amplifier; a second fuse box connected between the second input terminal and a first terminal for receiving a first voltage; and a diode connected between the second input terminal and a second terminal.

The first fuse box may include a plurality of first resistors connected in series between the second input terminal and the output terminal of the operational amplifier; and a plurality of first fuses which are cuttable and are connected in parallel with the first resistors, respectively. The second fuse box may include a plurality of second resistors connected in series between the second input terminal and the first terminal; and a plurality of second fuses which are cuttable and are connected in parallel with the second resistors, respectively.

The amplifier may further include a first resistor circuit connected between a terminal of the first fuse box and the output terminal of the operational amplifier and/or a second resistor circuit connected between a terminal of the second fuse box and the first terminal. The first voltage may be a ground voltage.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF INVENTION

Figure 1:
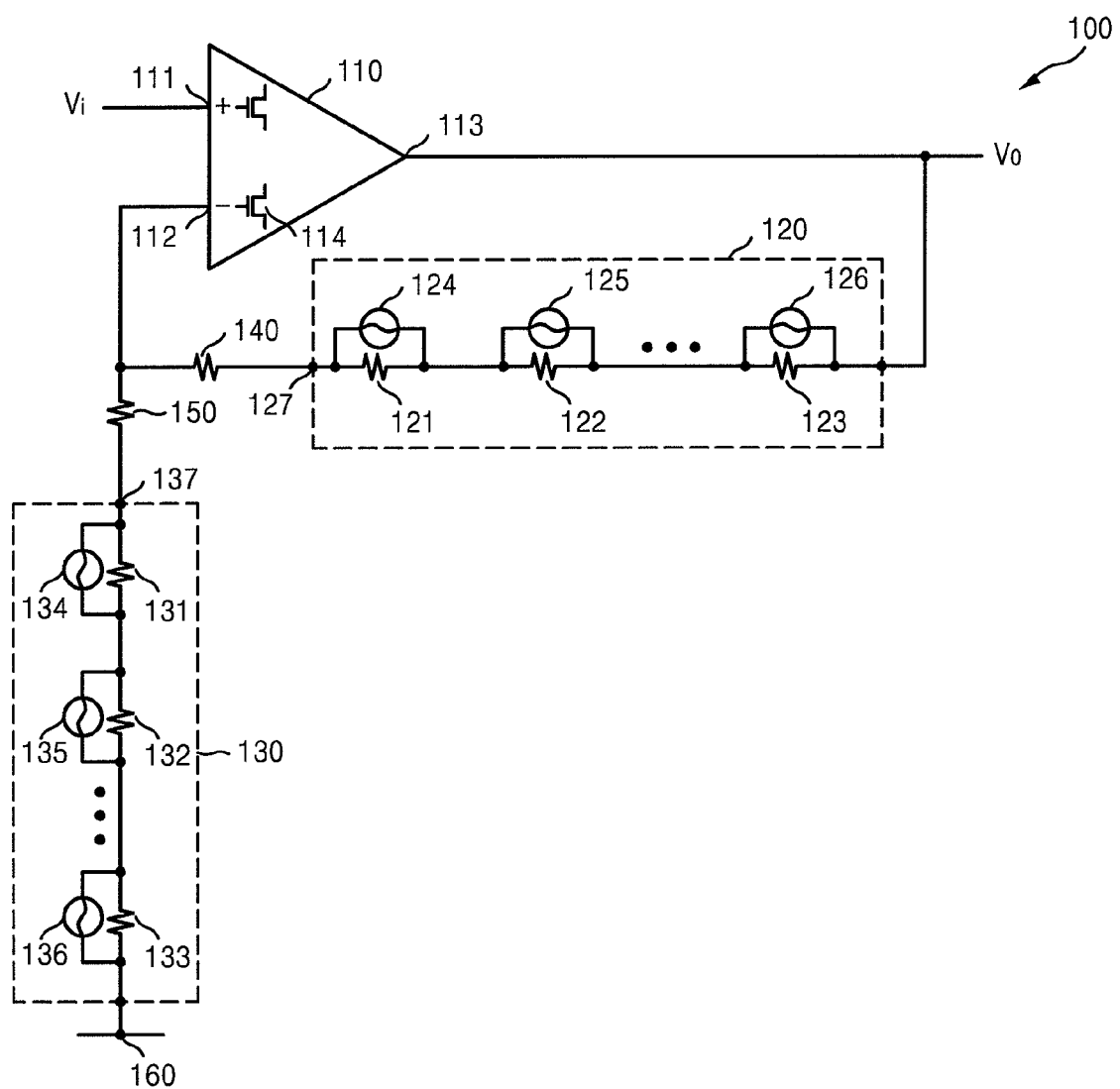
FIG. 1 contains a schematic diagram of an amplifier according to a first embodiment of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 illustrates an amplifier 100 according to a first embodiment of the present invention. The amplifier 100 includes an operational amplifier 110, a first resistor circuit 140, a first fuse box 120, a second resistor circuit 150, and a second fuse box 130.

The operational amplifier 110 includes a first input terminal 111 receiving a first input signal $V_i$, a second input terminal 112 receiving a second input signal, and an output terminal 113 outputting an output signal $V_O$. The operational amplifier 110 amplifies a difference between the first input signal $V_i$ and the second input signal and outputs the output signal $V_O$ according to a result of the amplification. The first input signal $V_i$ and the second input signal may be differential signals, but the present invention is not restricted thereto.

The first resistor circuit 140 is connected between the second input terminal 112 and a first node 127. The second resistor circuit 150 is connected between the second input terminal 112 and a second node 137. The first resistor circuit 140 and the second resistor circuit 150 may serve as reference resistors which determine a design target value of the output signal $V_O$ of the amplifier 100.

The first fuse box 120 includes a plurality of first resistors 121, 122, . . . , 123, which are connected in series between the first node 127 and the output terminal 113 of the operational amplifier 110, and a plurality of first fuses 124, 125, . . . , 126, which are cuttable (or, fusible) and respectively connected in parallel with the first resistors 121 through 123. A resistance of the first resistor circuit 140 may be greater than a resistance of each of the first resistors 121 through 123, but the present invention is not restricted thereto.

The second fuse box 130 includes a plurality of second resistors 131, 132, . . . , 133, which are connected in series between the second node 137 and a first terminal 160 receiving a first voltage (e.g., a ground voltage), and a plurality of second fuses 134, 135, . . . , 136, which are cuttable (or, fusible) and respectively connected in parallel with the second resistors 131 through 133. The first fuses 124 through 126 and the second fuses 134 through 136 may be implemented by anti-fuses. A resistance of the second resistor circuit 150 may be greater than a resistance of each of the second resistors 131 through 133, but the present invention is not restricted thereto.

When an offset occurs in the amplifier 100, the offset may be compensated for by cutting (or fusing) at least one fuse among the first fuses 124 through 126 or at least one fuse among the second fuses 134 through 136. The resistance of the first resistors 121 through 123 may be different from each other and the resistance of the second resistors 131 through 133 may be different from each other, but the present invention is not restricted thereto.

When the first resistor circuit 140 and the second resistor circuit 150 are not present, at least one fuse among the first fuses 124 through 126 or among the second fuses 134 through 136 may be cut (or, fused) in order to compensate for an offset of the amplifier 100 and then electrostatic discharge (ESD), which occurs during a polishing process of shaving the rear of a wafer on which the amplifier 100 is embodied to an appropriate thickness, may be input to the second input terminal 112 of the operational amplifier 110. At this time, the ESD input to the second input terminal 112 may destroy the second input terminal 112, i.e., a gate oxide layer of a MOS transistor 114.

However, according to some embodiments of the present invention, the amplifier 100 includes the first resistor circuit 140 and the second resistor circuit 150, which interrupt the ESD input to the second input terminal 112, i.e., the gate of the MOS transistor 114 or attenuate the magnitude of the ESD. The first resistor circuit 140 and the second resistor circuit 150 prevent the ESD, which is input via the first fuse box 120 or the second fuse box 130, from being input to the gate of the MOS transistor 114 included in the operational amplifier 110.

Figure 2:
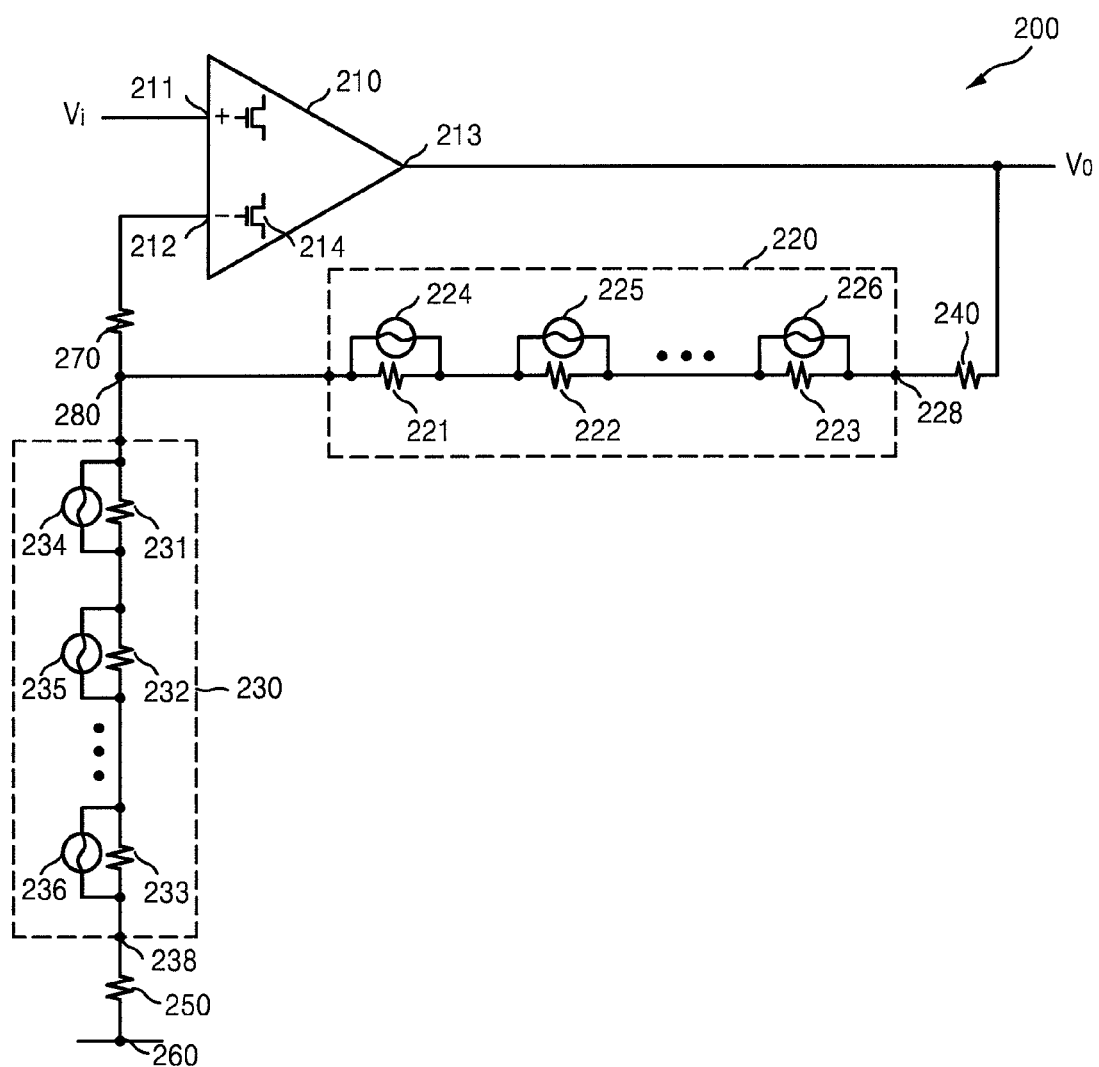
FIG. 2 contains a schematic diagram of an amplifier according to a second embodiment of the present invention.

FIG. 2 illustrates an amplifier 200 according to a second embodiment of the present invention. The amplifier 200 includes an operational amplifier 210, a first resistor circuit 270, a first fuse-box 220, and a second fuse-box 230.

The operational amplifier 210 includes a first input terminal 211 receiving a first input signal $V_i$, a second input terminal 212 receiving a second input signal, and an output terminal 213 outputting an output signal $V_O$. The operational amplifier 210 amplifies a difference between the first input signal $V_i$ and the second input signal and outputs the output signal $V_O$ according to a result of the amplification.

The first resistor circuit 270 is connected between the second input terminal 212 and a node 280 and restricts the magnitude of ESD, which is input to a gate of a MOS transistor 214 via the first fuse-box 220 or the second fuse-box 230. The first fuse-box 220 includes a plurality of first resistors 221, 222, ..., 223, which are connected in series between the node 280 and the output terminal 213 of the operational amplifier 210, and a plurality of first fuses 224, 225, ..., 226, which are cuttable (or, fusible) and respectively connected in parallel with the first resistors 221 through 223.

The second fuse box 230 includes a plurality of second resistors 231, 232, ..., 233, which are connected in series between the node 280 and a first terminal 260 receiving a first voltage (e.g., a ground voltage), and a plurality of second fuses 234, 235, ..., 236, which are cuttable and respectively connected in parallel with the second resistors 231 through 233.

The first fuses 224 through 226 and the second fuses 234 through 236 may be implemented by anti-fuses. When an offset occurs in the amplifier 200, the offset may be compensated for by cutting (or, fusing) using a laser at least one fuse among the first fuses 224 through 226 or at least one fuse among the second fuses 234 through 236.

The first resistor circuit 270 of the amplifier 200 prevents ESD, which occurs during a polishing process, from being input to the second input terminal 212, i.e., a gate of a MOS transistor 214 included in the operational amplifier 210. The amplifier 200 may further include a second resistor circuit 240, which is connected between a terminal 228 of the first fuse box 220 and the output terminal 213 of the operational amplifier 210, and/or a third resistor circuit 250, which is connected between a terminal 238 of the second fuse box 230 and the first terminal 260. The second resistor circuit 240 and the third resistor circuit 250 may serve as reference resistors which determine a target value of the output signal $V_O$ of the operational amplifier 210.

A resistance of the second resistor circuit 240 may be greater than a resistance of each of the first resistors 221 through 223, but the present invention is not restricted thereto. In addition, a resistance of the third resistor circuit 250 may be greater than a resistance of each of the second resistors 231 through 233, but the present invention is not restricted thereto. The resistance of the first resistors 221 through 223 may be different from each other and the resistance of the second resistors 231 through 233 may be different from each other.

Figure 3:
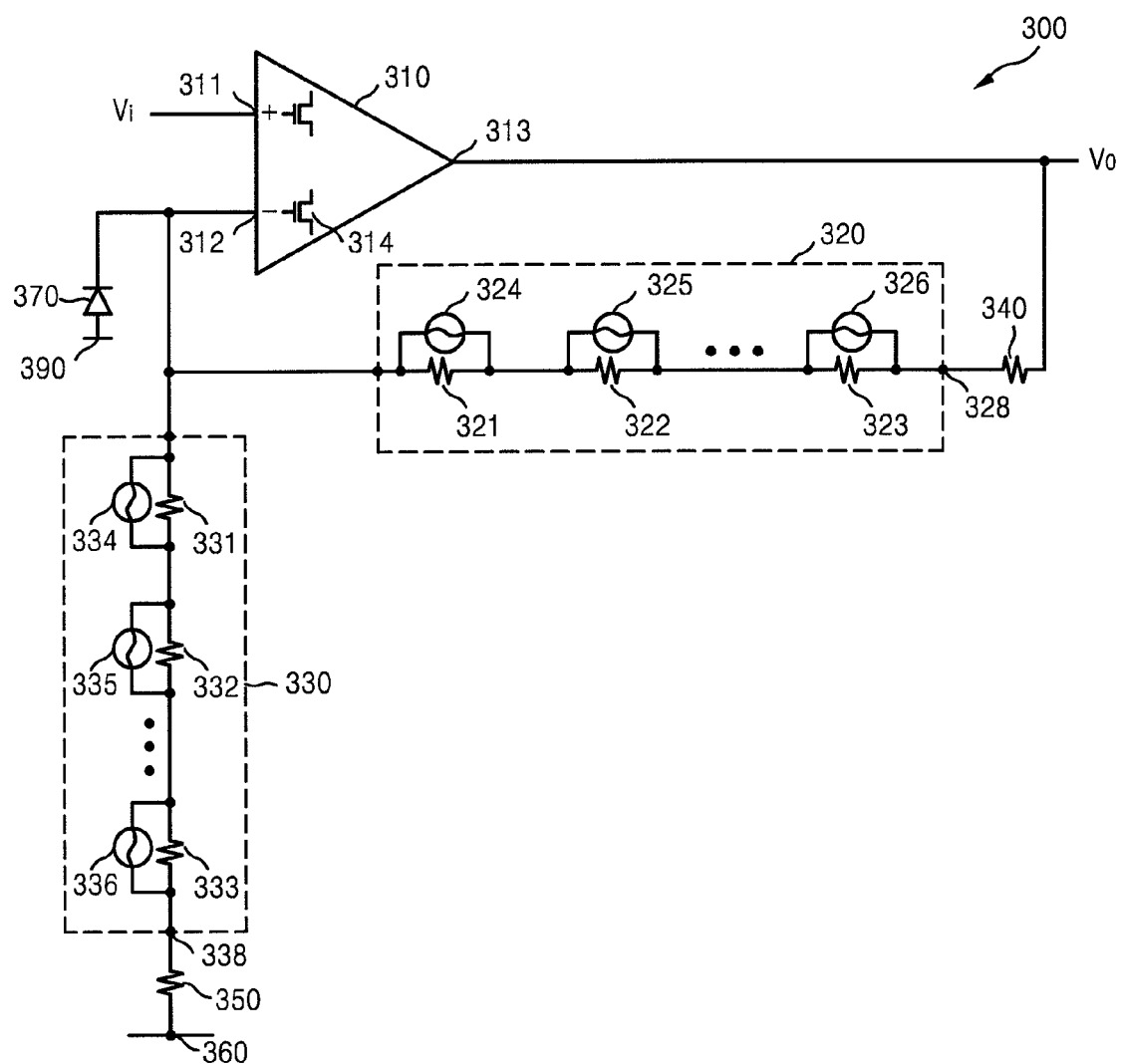
FIG. 3 contains a schematic diagram of an amplifier according to a third embodiment of the present invention.

FIG. 3 illustrates an amplifier 300 according to a third embodiment of the present invention. The amplifier 300 includes an operational amplifier 310, a first fuse box 320, a second fuse box 330, and a diode 370. The operational amplifier 310 includes a first input terminal 311 receiving a first input signal $V_i$, a second input terminal 312 receiving a second input signal, and an output terminal 313 outputting an output signal $V_O$.

The first fuse box 320 includes a plurality of first resistors 321, 322, ..., 323, which are connected in series between the second input terminal 312 and the output terminal 313 of the operational amplifier 310, and a plurality of first fuses 324, 325, ..., 326, which are cuttable (or, fusible) and respectively connected in parallel with the first resistors 321 through 323.

The second fuse box 330 includes a plurality of second resistors 331, 332, ..., 333, which are connected in series between the second input terminal 312 and a first terminal 360, and a plurality of second fuses 334, 335, ..., 336, which are cuttable and respectively connected in parallel with the second resistors 331 through 333.

When an offset occurs in the amplifier 300, the offset may be compensated for by cutting at least one fuse among the first fuses 324 through 326 or at least one fuse among the second fuses 334 through 336.

The diode 370 is connected between the second input terminal 312 and a second terminal 390. As described above with reference to FIG. 1, ESD generated during the polishing process is discharged to the second terminal 390 by the diode 370 when the ESD exceeds a predetermined magnitude. Accordingly, the diode 370 prevents the ESD, which occurs during the polishing process, from being input to the second input terminal 312, i.e., a gate of a MOS transistor 314. As a result, the diode 370 prevents a gate oxide layer of the MOS transistor 314 from being destroyed.

In addition, the amplifier 300 may further include a first resistor circuit 340, which is connected between a terminal 328 of the first fuse box 320 and the output terminal 313 of the operational amplifier 310, and/or a second resistor circuit 350, which is connected between a terminal 338 of the second fuse box 330 and the first terminal 360. The first resistor circuit 340 and the second resistor circuit 350 may serve as reference resistors which determine a design target value of the output signal $V_O$ of the amplifier 300. The first terminal 360 and the second terminal 390 may receive a ground voltage.

The resistance values of the first resistors 321 through 323 may be different from each other and the resistance values of the second resistors 331 through 333 may be different from each other.

Each of the amplifiers 100, 200, and 300 illustrated in FIGS. 1 through 3 may be used as a buffer for obtaining a stable output signal in a semiconductor device (e.g., a display driver integrated circuit (IC)).

According to the present invention, ESD occurring during manufacturing of an amplifier is prevented from being input to an input terminal of an operational amplifier and is thus prevented from destroying a transistor forming the input terminal of the operational amplifier. In addition, a failure rate in the amplifier manufacturing can be reduced.

While the present invention has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. An amplifier comprising:
   an operational amplifier comprising a first input terminal receiving a first input signal, a second input terminal receiving a second input signal, and an output terminal outputting an output signal;
   a first fuse box connected between the second input terminal and the output terminal of the operational amplifier;

a second fuse box connected between the second input terminal and a first terminal for receiving a first voltage; and a diode connected between the second input terminal and a second terminal, wherein the first fuse box comprises:

a plurality of first resistors connected in series between the second input terminal and the output terminal of the operational amplifier; and a plurality of first fuses which are cuttable and are connected in parallel with the first resistors, respectively, wherein the second fuse box comprises:

a plurality of second resistors connected in series between the second input terminal and the first terminal; and a plurality of second fuses which are cuttable and are connected in parallel with the second resistors, respectively.

2. The amplifier of claim 1, further comprising a first resistor circuit connected between a terminal of the first fuse box and the output terminal of the operational amplifier or a second resistor circuit connected between a terminal of the second fuse box and the first terminal.

* * * * *